(12) United States Patent
Lee

(10) Patent No.: US 7,078,339 B2
(45) Date of Patent: Jul. 18, 2006

(54) METHOD OF FORMING METAL LINE LAYER IN SEMICONDUCTOR DEVICE

(75) Inventor: Joon Hyeon Lee, Chungcheongbuk-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/731,482

(22) Filed: Dec. 10, 2003

(65) Prior Publication Data
US 2005/0014363 A1    Jan. 20, 2005

(30) Foreign Application Priority Data
Jul. 18, 2003    (KR)    ............ 10-2003-0049458

(51) Int. Cl.
*H01L 21/44*    (2006.01)

(52) U.S. Cl. .............. 438/669; 438/671; 438/673; 438/685; 438/688; 438/720; 438/737; 438/738; 438/739; 438/740; 438/742

(58) Field of Classification Search ............ 438/669, 438/671, 673, 685, 688, 720, 737–739, 740, 438/742, 754
See application file for complete search history.

(56) References Cited

U.S. PATENT DOCUMENTS

| 4,350,563 A | * | 9/1982 | Takada et al. | 438/694 |
|---|---|---|---|---|
| 4,798,650 A | * | 1/1989 | Nakamura et al. | 438/673 |
| 5,061,647 A | * | 10/1991 | Roth et al. | 438/304 |
| 5,143,866 A | * | 9/1992 | Matsutani | 438/696 |
| 5,368,686 A | * | 11/1994 | Tatsumi et al. | 438/696 |
| 5,462,892 A | * | 10/1995 | Gabriel | 438/656 |
| 5,518,959 A | * | 5/1996 | Jang et al. | 438/627 |
| 5,540,812 A | * | 7/1996 | Kadomura | 438/710 |
| 5,599,740 A | * | 2/1997 | Jang et al. | 438/626 |
| 5,698,072 A | * | 12/1997 | Fukuda | 438/592 |
| 5,726,102 A | * | 3/1998 | Lo | 438/718 |
| 5,753,546 A | * | 5/1998 | Koh et al. | 438/229 |
| 5,776,821 A | * | 7/1998 | Haskell et al. | 438/585 |
| 5,843,848 A | * | 12/1998 | Yanagawa | 438/738 |
| 5,880,035 A | * | 3/1999 | Fukuda | 438/734 |
| 6,017,826 A | * | 1/2000 | Zhou et al. | 438/720 |
| 6,214,737 B1 | * | 4/2001 | Lyons et al. | 438/706 |
| 6,383,942 B1 | * | 5/2002 | Narita et al. | 438/720 |
| 6,451,665 B1 | * | 9/2002 | Yunogami et al. | 438/397 |
| 6,500,681 B1 | * | 12/2002 | Christian et al. | 438/8 |
| 6,503,844 B1 | * | 1/2003 | Curello | 438/710 |
| 6,509,219 B1 | * | 1/2003 | Tsou et al. | 438/197 |
| 6,511,918 B1 | * | 1/2003 | Wege et al. | 438/714 |
| 6,528,363 B1 | * | 3/2003 | Ku et al. | 438/197 |
| 6,541,320 B1 | * | 4/2003 | Brown et al. | 438/197 |

* cited by examiner

*Primary Examiner*—Lynne A. Gurley
(74) *Attorney, Agent, or Firm*—Mayer, Brown, Rowe & Maw LLP

(57) ABSTRACT

The present invention is provided to form a metal line layer in a semiconductor device, wherein at least one conductive layer of a plurality of conductive layers is etched, a side wall oxide film is formed on side walls of some conductive layers of the etched conductive layers, and then the other conductive layers are etched. According to the present invention, since it is possible to prevent attacks against the side walls, which may occur due to sputtering and bending of plasma ions, it is possible to enhance yield and reliability of a semiconductor device.

12 Claims, 2 Drawing Sheets

METHOD OF FORMING METAL LINE LAYER IN SEMICONDUCTOR DEVICE

BACKGROUND

1. Field of the Invention

The present invention relates to a method of forming a metal line layer in a semiconductor device and, more specifically, to a method of forming a metal line layer in a semiconductor device with reliability, wherein at least one conductive layer of a plurality of conductive layers is etched, a side wall oxide film is formed on side walls of some conductive layers of the etched conductive layers, and then the other conductive layers are etched.

2. Discussion of Related Art

Now, a conventional method of forming a metal line layer in a semiconductor device will be described with reference to FIGS. 1A to 1C.

Referring to FIG. 1A, a metal line layer 110 is deposited on a lower oxide film (not shown). At that time, the metal line layer 110 can have a multilayer structure. In FIG. 1A, the metal line layer 110 has three layers 110a, 110b and 110c. Next, a photosensitive material 120 is coated thereon and patterned to open a desired portion.

Referring to FIG. 1B, the multi-layers of the metal line layer 110 are sequentially dry-etched using the patterned photosensitive material 120 as a mask. However, in the course of dry-etching the multilayered metal line layer 10, plasma ions (A, B, C) for etching go on with exhibition of various phenomena: that is, a case of linear motion (A), a case of bending due to the photosensitive material (B), and a case of ion sputtering from a bottom having been etched (C). The patterning process using plasma ions having the linear motion causes no problem, but in the patterning process using ions exhibiting the bending phenomenon and the sputtering phenomenon, side walls of the metal line layer 110 are attacked. For this reason, the reliability in the process of forming the metal line layer 110 is deteriorated.

FIG. 1C is a schematic cross-sectional view illustrating a state where the whole metal line layer 110 has been etched. When the etching process is performed up to a lowermost layer 110a of the metal line layer 110, the attacks against the side walls become serious, so that non-desired portions can be etched. In a serious case, the metal line layer may have an "I" shape, and in a more serious case, the patterns thereof may be collapsed.

Specifically, when an Al layer is used as the intermediate layer 110b, such phenomenon can occur more seriously. Further, as a width of the metal line layer 110 becomes smaller and a gap between the metal line layers becomes smaller, such phenomenon can occur more seriously. Furthermore, for the reason of problems described above, a void can be generated at a portion D when an interlayer insulating film is deposited in the subsequent process.

Therefore, measures for ensuring stability in the process of forming the metal line layer have been required.

SUMMARY OF THE INVENTION

Accordingly, the present invention is contrived to solve the aforementioned problems, and is directed to a method of forming a metal line layer in a semiconductor device capable of ensuring stable process conditions.

One aspect of the present invention is to provide a method of forming a metal line layer in a semiconductor device, depositing a metal line layer having a plurality of conductive layers on a semiconductor structure; depositing and patterning a photosensitive material on the metal line layer; etching at least one conductive layer of the plurality of conductive layers using the photosensitive material as a mask; forming a side wall oxide film on a side wall of the at least one conductive layer of the etched conductive layers; and etching the non-etched conductive layer of the conductive layers constituting the metal line layer.

The "plurality of conductive layers" means that two or more conductive layers made of different materials are laminated. At leas one conductive layer of the two or more conductive layers is first etched, and then an oxide film is formed on side walls of at least one conductive layer of the etched conductive layer(s). Then, the remaining metal line layer is etched.

On the other hand, at least one of the conductive layers may be made of Al, and preferably the metal line layer is formed by laminating a Ti/TiN layer, an Al layer and a Ti/TiN layer in this order.

Further, the Ti/TiN layer may be dry-etched using activated plasma comprising $Cl_2/BCl_3/N_2$ gas, and side walls of the Al layer may be oxidized into $Al_2O_3$.

Furthermore, an uppermost layer of the semiconductor structure may be an oxide film.

On the other hand, an insulating film as a hard mask may be additionally formed between an uppermost layer of the metal line layer and the photosensitive material. The insulating film is preferably an oxide film or a nitride film.

The insulating film may be etched by means of a dry etching process using activated plasma comprising a combination of $CHF_3/CF_4/Ar$ or $C_xF_y$ (where x, y are natural numbers)/$O_2$/Ar gas.

BRIEF DESCRIPTION OF THE DRAWINGS

The above and other objects, advantages and features of the present invention will become apparent from the following description of preferred embodiments given in conjunction with the accompanying drawings, in which.

DETAILED DESCRIPTION OF PREFERRED EMBODIMENTS

Now, a method of forming a metal line layer in a semiconductor device according to embodiments of the present invention will be described in detail with reference to accompanying drawings. However, the present invention is not limited to the embodiments disclosed in the following description, but can be implemented into various changes and modifications. Thus, these embodiments are intended to completely inform those skilled in the art of a scope of the present invention.

Hereinafter, the method of forming a metal line layer in a semiconductor device according to a preferred embodiment of the present invention will be described with reference to FIGS. 2A to 2E.

Figure 1A:
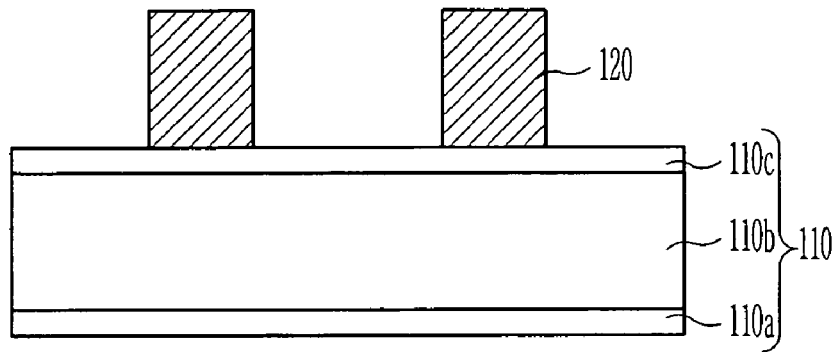
FIGS. 1A to 1C are views illustrating a conventional method of forming a metal line layer in a semiconductor device.
Figure 1B:
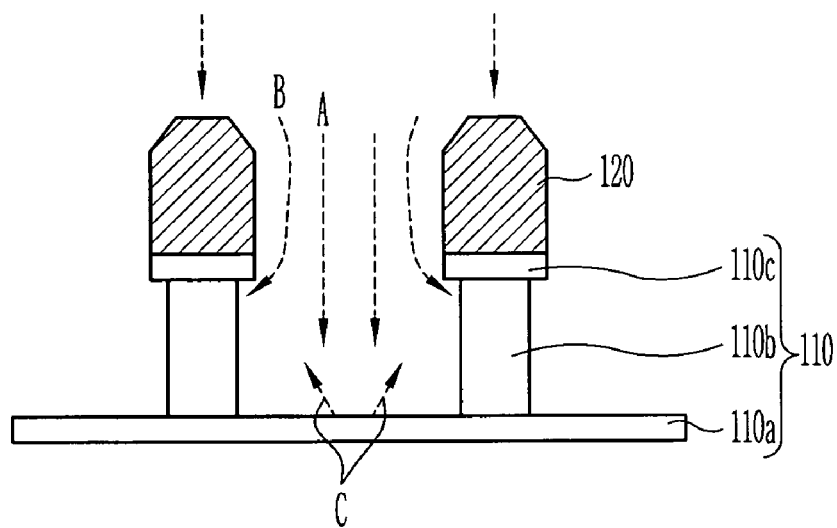
Figure 1C:
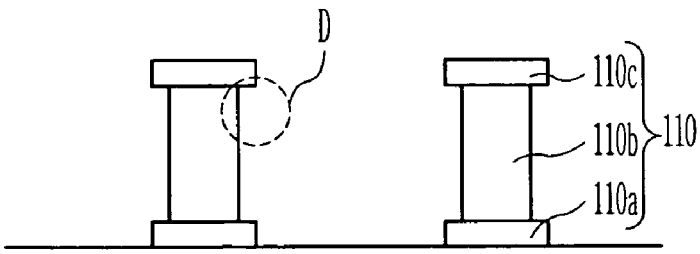
Figure 2A:
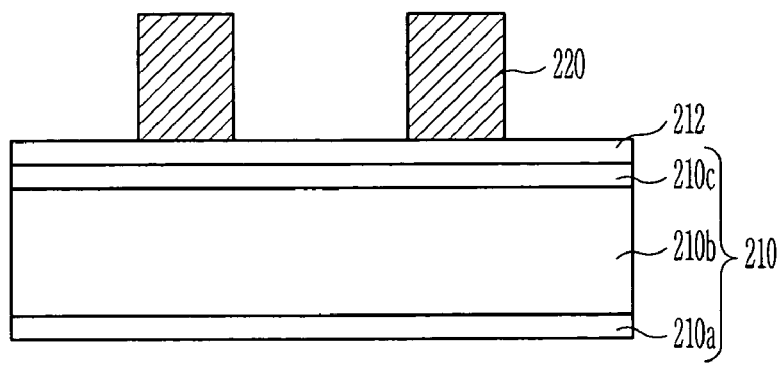
FIGS. 2A to 2E are views illustrating a method of forming a metal line layer in a semiconductor device according to a preferred embodiment of the present invention.

Referring to FIG. 2A, a metal line layer 210 is formed on a semiconductor structure (not shown). The "semiconductor structure" is a generic name indicating a structure manufactured by patterning various insulating films and conductive films on a semiconductor substrate to be used in a semiconductor process. Of course, contact plugs, etc. may be formed inside of the semiconductor structure. An oxide film may be formed on the uppermost layer of the semiconductor structure.

The metal line layer 210 may comprise a plurality of conductive layer, and in this embodiment, comprises first, second and third conductive layers. Preferably, the second conductive layer 210b is made of Al, and the first conductive layer 210a and the third conductive layer 210c have a double layer of Ti/TiN.

Specifically, the metal line layer 210 may comprise a first Ti/TiN layer 210a, an Al layer 210b and a second Ti/TiN layer. The Ti layer of the first Ti/TiN layer (210a) performs a function of enhancing the bonding force, and the TiN layer serves as a diffusion barrier film. Since the Al layer 210b has a low resistance, the Al layer mainly performs a function of delivering electrical signals, the Ti layer of the second Ti/TiN layer 210c performs a function of enhancing the bonding force, and the TiN layer performs a function of absorbing light and reducing reflection of the light in patterning the photosensitive material. A lower oxide film is not specifically limited, but may comprise various kinds such as inter metal dielectric (IMD) or poly metal dielectric (PMD), etc.

Next, an insulating film 212 as a hard mask is deposited on the resultant structure. Thereafter, the photosensitive material 220 is coated on the insulating film 212 and patterned. The insulating film 212 may be formed out of various kinds such as an oxide film, a nitride film, etc., and preferably a nitride film. The insulating film 212 can be deposited to be 100 to 2000 Å thick. The hard mask performs a function of preventing problems from occurring in the metal line layer due to lack of selectivity ratio of the metal line layer to the photosensitive material in a process of etching the metal line layer which is a subsequent process.

Figure 2B:
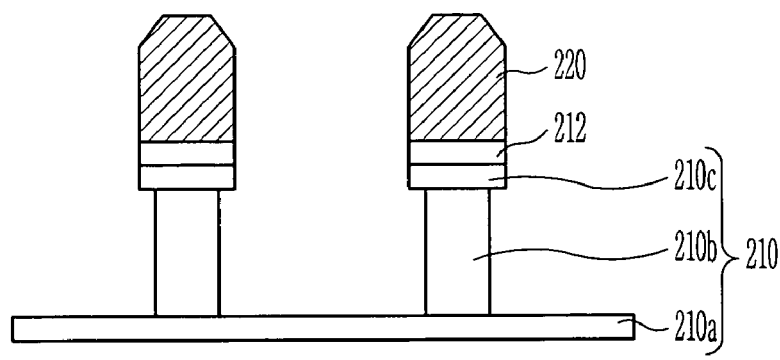

Referring to FIG. 2B, by using the photosensitive material 220 patterned in predetermined positions as a mask, the insulating film 212, the second Ti/TiN layer 201c and the Al layer 210b are sequentially etched. At that time, a dry etching process using activated plasma comprising a combination of $CHF_3/CF_4/Ar$ and using the photosensitive material 220 as a mask is carried out to the insulating film 212. $C_xF_y$ (x, y are natural numbers)/$O_2$/Ar gas may be also used. In addition, a dry etching process using activated plasma comprising $Cl_2/BCl_3/N_2$ is carried out to the second Ti/TiN layer 210c and the Al layer 210b.

In the course of dry-etching the Al layer 210b, plasma ions (A, B, C) for etching go on in various ways: that is, a case of linear motion (A), a case of bending due to the photosensitive material (B), and a case of ion sputtering from a bottom having been etched (C). Therefore, plasma ions exhibiting the bending phenomenon and the sputtering phenomenon attacks the side walls of the metal line layer 210, so that the side walls of the metal line layer 210 are over-etched as shown in FIG. 2B. Since the first Ti/TiN layer 210a has physical properties different from the Al layer, the sputtering of plasma ions mainly tends to occur from a time point when the first Ti/TiN layer 210a is exposed.

Figure 2C:
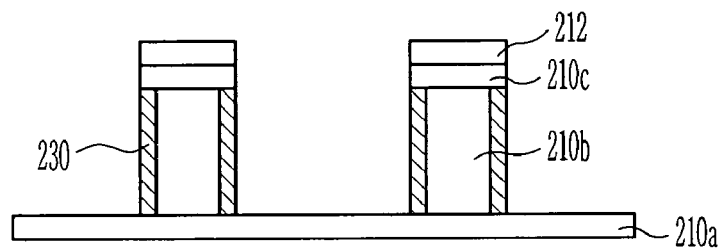

Referring to FIG. 2C, by removing the photosensitive material 220 and allowing the Al layer 210b to react with ozone $O_3$, an $Al_2O_3$ film 230 is grown on the side walls of the Al layer 210b. The $Al_2O_3$ film 230 is cirown to com-Densate for a thickness of over-etched portions of the Al layer 210b. There was a problem that the Al layer is corroded when the metal line layer is exposed to an atmosphere for a long time. However, by previously growing the $Al_2O_3$ film 230, corrosion of the Al layer can be originally prevented. It is obvious that the kind of film to be oxidized can be changed depending upon the kind of metal formed.

Figure 2D:
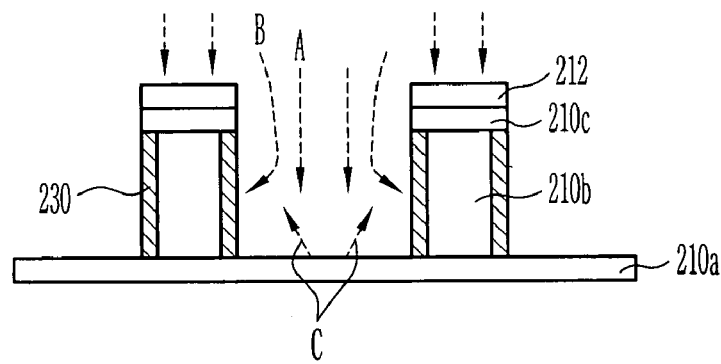
Figure 2E:
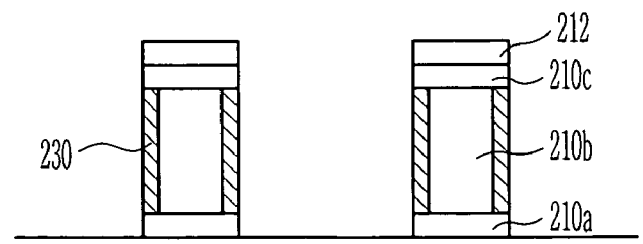

Referring to FIG. 2D, with the first Ti/TiN layer 210a remaining in the lower portion of the Al layer 210b, the first Ti/TiN layer 210a is dry-etched using activated plasma comprising $Cl_2/BCl_3/N_2$ gas. In this case, the bending and sputtering of the plasma ions can occur, but the generation of void, which was a problem of the conventional art, does not occur. On the other hand, since the Ti/TiN layer 210a and the hard mask form an excellent selectivity ratio (about 1:30), the first Ti/TiN layer 210a can be etched with high reliability.

Although the foregoing description has been made with reference to the preferred embodiments, the embodiments are intended to exemplify the present invention, not to limit the present invention. Furthermore, it is to be understood by the ordinary skilled in the art that changes and modifications of the present invention may be made without departing from the spirit and scope of the present invention and appended claims.

According to the present invention, by etching at leas one conductive layer of the plurality of conductive layers, forming an oxide film on side walls of some conductive layers of the etched conductive layers and then etching the remaining conductive layers, it is possible to prevent attacks against the side walls, which may occur due to sputtering and bending of plasma ions, and thus it is possible to enhance yield and reliability of a semiconductor device. Therefore, even when the gap between the metal line layers is small, the patterning can be performed efficiently.

Meanwhile, since the metal line layer is not patterned into an "I" shape, unlike the conventional art, a void can hardly be generated.

On the other hand, since it is possible to prevent loss of the metal line layer from occurring due to lack of selectivity ratio to the photosensitive material in etching the metal line layer by use of a hard mask, reliability of a device can be further improved.

What is claimed is:

1. A method of forming a metal line layer in a semiconductor device, comprising:
   depositing a diffusion barrier layer, a metal layer and an anti reflection layer on a semiconductor substrate;
   depositing an insulating film on the anti reflection layer;
   depositing and patterning a photosensitive material on the insulating film;
   etching portions of the insulating film, the anti reflection layer and the metal layer using activated plasma and the photosensitive material as a mask, whereby a portions of side walls of the metal layer are over-etched by plasma ions;
   removing the photosensitive material;
   forming a side wall oxide film on the over-etched side walls of the metal layer by reacting the metal layer with ozone; and
   etching portions of the diffusion barrier layer using the insulating film and the side wall oxide film as an etch mask.

2. A method of forming a metal line layer in a semiconductor device according to claim 1, wherein the metal layer is made of aluminum (Al).

3. A method of forming a metal line layer in a semiconductor device according to claim 1, wherein the diffusion barrier layer is made of Ti/TiN layer, and the anti reflection layer is made of Ti/TiN layer, and the side wall oxide film is an $Al_2O_3$ film.

4. A method of forming a metal line in a semiconductor memory device according to claim 1, wherein the the anti reflection layer, the metal layer and the diffusion barrier layer are dry-etched using activated plasma comprising $Cl_2/BCl_3/N_2$ gas.

5. A method of forming a metal line in a semiconductor device according to claim 1, wherein the insulating film is a nitride film.

6. A method of forming a metal line in a semiconductor device according to claim 1, wherein the insulating film is etched by means of a dry etching process using activated plasma comprising a combination of $CHF_3/CF_4/Ar$ or $C_xF_y$ (where x, y are natural numbers)/$O_2$/Ar gas.

7. A method of forming a metal line layer in a semiconductor device, comprising:
    depositing a first, second and third conductive layers on a semiconductor substrate;
    depositing an insulating film on the third conductive layer;
    dry etching portions of the insulating film, the third and the second conductive layers using activated plasma, whereby a portions of side walls of the second conductive layer are over-etched by plasma ions;
    forming a side wall oxide film on the side walls of the over-etched second conductive layer by reacting the second conductive layer with ozone; and
    etching portions of the first conductive layer using the insulating film and the side wall oxide film as an etch mask.

8. A method of forming a metal line layer in a semiconductor device according to claim 7, wherein the first conductive layer is made of Ti/TiN layer, the second conductive layer is made of aluminum (Al), and the third conductive layer is made of Ti/TiN layer.

9. A method of forming a metal line layer in a semiconductor device according to claim 9, wherein the side wall oxide film is an $Al_2O_3$ film.

10. A method of forming a metal line in a semiconductor device according to claim 7, wherein the insulating film is a nitride film.

11. A method of forming a metal line in a semiconductor device according to claim 7, wherein the insulating film is etched by means of a dry etching process using activated plasma comprising a combination of $CHF_3/CF_4/Ar$ or $C_xF_y$ (where x, y are natural numbers)/$O_2$/Ar gas.

12. A method of forming a metal line in a semiconductor memory device according to claim 7, wherein the third and second conductive layers are dry-etched using activated plasma comprising $Cl_2/BCl_3/N_2$ gas.

* * * * *